(12) United States Patent
Nakayama et al.

(10) Patent No.: US 10,177,008 B2
(45) Date of Patent: Jan. 8, 2019

(54) SILICON WAFER AND METHOD FOR MANUFACTURING THE SAME

(71) Applicant: SUMCO CORPORATION, Tokyo (JP)

(72) Inventors: Takashi Nakayama, Tokyo (JP); Takeo Katoh, Tokyo (JP); Kazumi Tanabe, Tokyo (JP); Shigeru Umeno, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 15/104,812

(22) PCT Filed: Jan. 14, 2014

(86) PCT No.: PCT/JP2014/000128
§ 371 (c)(1),
(2) Date: Jun. 15, 2016

(87) PCT Pub. No.: WO2015/107562
PCT Pub. Date: Jul. 23, 2015

(65) Prior Publication Data
US 2016/0322233 A1    Nov. 3, 2016

(51) Int. Cl.
*H01L 21/32* (2006.01)
*H01L 29/32* (2006.01)
(Continued)

(52) U.S. Cl.
CPC .......... *H01L 21/3221* (2013.01); *C30B 15/10* (2013.01); *C30B 15/203* (2013.01);
(Continued)

(58) Field of Classification Search
CPC .................................................. H01L 21/322
(Continued)

(56) References Cited

U.S. PATENT DOCUMENTS

2009/0242843 A1    10/2009    Ebara
2010/0105191 A1    4/2010    Hayamizu et al.
(Continued)

FOREIGN PATENT DOCUMENTS

JP    2008-028355 A    2/2008
JP    2008-207991 A    9/2008
(Continued)

OTHER PUBLICATIONS

International Search Report and Written Opinion issued with respect to Application No. PCT/JP2014/000128, dated Mar. 11, 2014.
International Preliminary Report on Patentability issued with respect to Application No. PCT/JP2014/000128, dated Jul. 19, 2016.

*Primary Examiner* — Moazzam Hossain
*Assistant Examiner* — Omar Mojaddedi
(74) *Attorney, Agent, or Firm* — Greenblum & Bernstein, P.L.C.

(57) ABSTRACT

This method for manufacturing a silicon wafer includes: a first heat treatment step of performing RTP treatment on the silicon wafer in an oxidizing atmosphere; a step of removing a region in the silicon wafer in which an oxygen concentration increases in the first heat treatment step; a second heat treatment step of performing, after performing this removing step, RTP treatment on the silicon wafer in a nitriding atmosphere or an Ar atmosphere; and a step of removing, after performing the second heat treatment step, a region in the silicon wafer in which an oxygen concentration decreases in the second heat treatment step. This method enables the manufacture of a silicon wafer in which latent defects such as OSF nuclei and oxygen precipitate nuclei existing in a $P_V$ region are destroyed or reduced, and that has a gettering site.

8 Claims, 3 Drawing Sheets

(51) Int. Cl.
*C30B 15/20* (2006.01)
*C30B 15/10* (2006.01)
*H01L 21/322* (2006.01)
*C30B 29/06* (2006.01)
*C30B 33/02* (2006.01)
*H01L 21/324* (2006.01)

(52) U.S. Cl.
CPC .............. *C30B 29/06* (2013.01); *C30B 33/02* (2013.01); *H01L 21/322* (2013.01); *H01L 21/324* (2013.01); *H01L 21/3225* (2013.01); *H01L 29/32* (2013.01)

(58) Field of Classification Search
USPC ........................................................ 257/629
See application file for complete search history.

(56) References Cited

U.S. PATENT DOCUMENTS

2010/0290971 A1* 11/2010 Itou .................... C30B 15/00
 423/348
2013/0093060 A1* 4/2013 Oka .................... C30B 29/06
 257/618
2015/0001680 A1* 1/2015 Oka .................... H01L 21/3225
 257/617

FOREIGN PATENT DOCUMENTS

| JP | 2009-170656 A | 7/2009 |
| JP | 2010-267846 A | 11/2010 |
| TW | 201245516 A | 11/2012 |
| TW | 201314778 A | 4/2013 |

\* cited by examiner

SILICON WAFER AND METHOD FOR MANUFACTURING THE SAME

TECHNICAL FIELD

The present invention relates to a silicon wafer that is grown by the Czochralski method and preferably used for substrates and the like of semiconductor devices, and to a method for manufacturing the same.

BACKGROUND ART

A silicon wafer used as a substrate of a semiconductor device is cut from a silicon single crystal ingot, which is typically grown by the Czochralski method (hereafter, also referred to as "the CZ method"), and is manufactured through steps such as polishing. The CZ method is a method in which a seed crystal is dipped into and pulled upward from melted silicon in a quartz crucible so as to grow a single crystal. Generally, a crystal grown by this method includes a crystal defect called a grown-in defect.

Given that the pulling speed of a silicon single crystal is denoted by V, and the temperature gradient in the single crystal in its growth direction immediately after the pulling is denoted by G, the type of a grown-in defect introduced into the silicon crystal depends on V/G.

Figure 1:
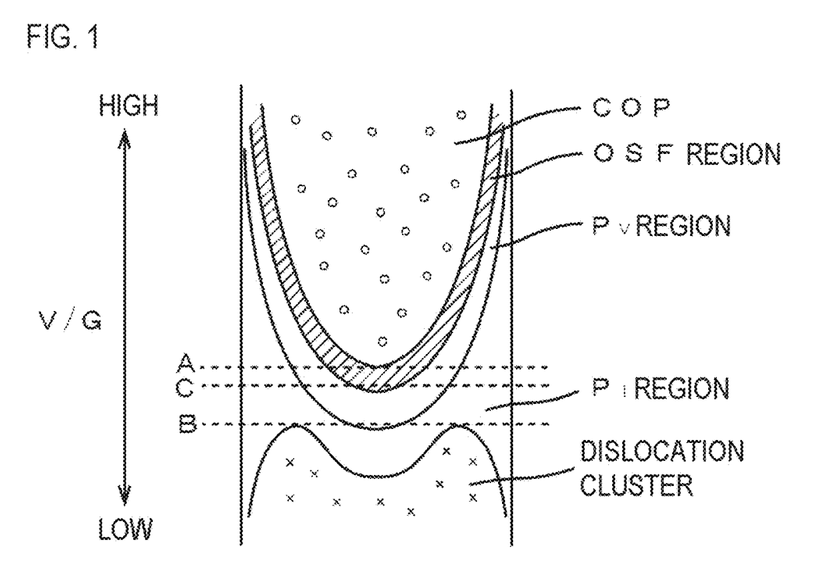
FIG. 1 is a longitudinal cross sectional view schematically illustrating an example of the relation between defect distribution and V/G, in a pulled silicon single crystal.

FIG. 1 is a longitudinal cross sectional view of a pulled single crystal, schematically illustrating an example of the relation between a defect distribution and V/G. The temperature gradient G is considered to be generally constant based on the thermal property of a hot-zone structure in a CZ furnace, and thus it is possible to control V/G by adjusting the pulling speed V. FIG. 1 is a diagram schematically illustrating the results of observing, by X-ray topography, the cross section of a single crystal that is obtained by cutting the crystal along its central axis, applying Cu thereto, and performing heat treatment thereon, the crystal being grown with V/G gradually decreased (FIG. 2, which will be described later, is also made by the same technique). The defect distribution illustrated in FIG. 1 is that of the case of growing a single crystal under specified conditions. The defect distribution (boundaries between defect regions) changes due to the shape of the hot zone, the presence/absence of a magnetic field, and the like.

In FIG. 1, a Crystal Originated Particle (COP) region is a region including a COP, which is the aggregate of vacancies (a microvoid) that lack atoms that should have constituted a crystal lattice at the time of growing a single crystal. A dislocation cluster region is a region including a dislocation cluster, which is an aggregate of interstitial silicon atoms that are excessively taken in between lattices. In the COP region, the closer a COP is to an OSF region, the smaller the size of a COP.

A grown-in defect has an adverse effect on the properties of a semiconductor device. For example, in the case of forming a MOS-FET on a silicon wafer, thermal oxidation is performed on the surface of the wafer for the formation of a gate oxide film. At this point, if a COP in the vicinity of the surface is taken into the oxide film, the gate oxide integrity (GOI) property of a semiconductor element deteriorates. In addition, a dislocation cluster also becomes a cause of poor properties of the device. For this reason, researches and developments have been conducted to obtain silicon wafers without these grown-in defects contained.

As illustrated in FIG. 1, a large V/G (a high pulling speed) results in excess vacancies, introducing a COP into a single crystal. A small V/G (a low pulling speed) results in excess interstitial silicon atoms, facilitating the occurrence of a dislocation cluster. In the growth of a silicon single crystal, in order to increase its productivity, the pulling speed is usually increased, making V/G large, and thus a wafer obtained from a pulled single crystal includes a COP.

A single crystal totally made up of a defect-free region, in which no COPs or dislocation clusters are included, is manufactured by performing crystal pulling while appropriately controlling the ratio (V/G) of the pulling speed V of the silicon single crystal to the temperature gradient G in the single crystal in its growth direction immediately after the pulling. That is, it is possible to preclude the introduction of a COP and a dislocation cluster into a crystal by controlling a pulling apparatus such that, in FIG. 1, V/G falls between a value equivalent to a position A and a value equivalent to a position B.

Figure 2:
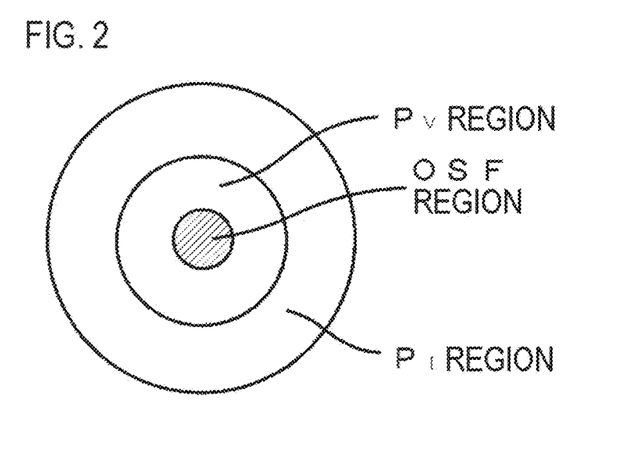
FIG. 2 is a diagram schematically illustrating a crosscut of a pulled silicon single crystal.

FIG. 2 is a diagram schematically illustrating a crosscut of a pulled silicon single crystal. FIG. 2 illustrates a wafer obtained by cutting a single crystal that is grown by controlling V/G to a value equivalent to a position C illustrated in FIG. 1. As illustrated in FIG. 2, an OSF region exists in the central part of the wafer, on the outside of which a $P_V$ region and a $P_I$ region exist in this order.

These regions are sandwiched between a region that includes a COP, which is an aggregate of vacancies, and a region that includes a dislocation cluster, which is an aggregate of interstitial silicon atoms, and are considered as defect-free regions, in which vacancies and interstitial silicon atoms balance out in terms of number and easily merge to disappear. The $P_V$ region is close to a region in which a COP occurs, and is a defect-free region in which a vacancy-type point defect is predominant. The $P_I$ region is adjacent to a region in which a dislocation cluster occurs, and is a defect-free region in which an interstitial-silicon-type point defect is predominant.

However, even such a wafer that consists of defect-free regions including no COPs or dislocation clusters is not always a perfect defect-free wafer. Although being a defect-free region, the OSF region is adjacent to a region in which COPs occur, and includes sheet-shaped oxygen precipitates (OSF nuclei) in an as-grown state. When the wafer is subjected to thermal oxidation treatment at a high temperature (generally from 1000° C. to 1200° C.), the OSF nuclei become obvious as an oxidation induced stacking fault (OSF).

The $P_V$ region includes oxygen precipitate nuclei in an as-grown state. When two-stage heat treatment is performed at a low temperature and a high temperature (e.g., at 800° C. and 1000° C.), an oxygen precipitate is prone to occur in the $P_V$ region. The $P_I$ region includes few oxygen precipitate nuclei in an as-grown state, and is a region in which an oxygen precipitate hardly occurs even heat treatment is performed thereon.

Defects existing in the OSF region and $P_V$ region described above are defects that become obvious when heat treatment or the like is performed under specific conditions. However, there is an increasingly unignorable influence on the yield of devices exerted by a microfine COP as well as an OSF region, which is not obvious in an as-grown state, and a defect existing in the $P_V$ region. For example, it is well-known that if an OSF occurring in the thermal oxidation at the high temperatures described above is generated and grown on the surface of a wafer, the OSF causes leakage current, leading to the deterioration in device properties. In addition, if oxygen precipitate nuclei included in the $P_V$ region forms oxygen precipitates in a heat treatment process in a manufacture process of a device, and the oxygen precipitates remain in an active layer of an element that constitutes a device, there is the risk of leakage current occurring in the device.

For this reason, it is important for a silicon wafer to have a reduced number of grown-in defects (including silicon oxides) in its outer-layer portion on which a device is to be formed.

Patent Literature 1 discloses a method for manufacturing a silicon single crystal wafer in which a silicon single crystal wafer having a surface, in its radial direction, the entirety of which is an N region (a region in which vacancy-type point defects and interstitial-silicon-type point defect are in proper quantities) is subjected to a rapid thermal process in an oxidizing atmosphere and subjected to a rapid thermal process in a nitriding atmosphere, an Ar atmosphere, or a mixed atmosphere thereof after the removal of an oxide film formed by the rapid thermal process in the oxidizing atmosphere. Patent Literature 1 describes that this enables the manufacture of a silicon wafer including no COPs, having a low OSF density, and including a bulk micro defect (BMD) in its bulk portion.

A BMD is a grown oxygen precipitate nucleus included in a semiconductor substrate, functioning as a gettering site that takes heavy metals therein. In a manufacture step for a semiconductor device, a BMD captures heavy metals, whereby it is possible to avoid the properties of a device from deteriorating due to the contamination of a device formation region in a silicon wafer by the heavy metal.

The present inventors investigated, by experiment, what kind of defect occurs in a wafer by the manufacturing method described in Patent Literature 1. In the manufacturing method, a condition for "a rapid thermal process in an oxidizing atmosphere" was set to 1250° C.×10 seconds. It was confirmed that OSF defects can be inactivated by this manufacturing method.

However, when reactive ion etching (RIE) was performed on a wafer having been subjected to such a process, there were observed sheet-shaped oxygen precipitates (OSF nuclei) in an OSF region and oxygen precipitate nuclei in a $P_V$ region having sizes of 9 nm or more (hereafter, referred to as "grown-in defects with silicon oxides"), as projections on an etching surface. That is, it was found that grown-in defects with silicon oxides cannot be eliminated by the oxidizing heat treatment at 1250° C.×10 seconds. Therefore, such a wafer cannot meet the manufacture of finer devices in the future because defects become obvious through heat treatment process and the like in a device step (a device manufacture process) and may have an adverse effect on properties of a device.

When a temperature in the oxidizing heat treatment is further raised, it is possible to destroy OSF nuclei and oxygen precipitate nuclei in a $P_V$ region up to the inner part of a wafer, but grown-in defects with silicon oxides remain in the vicinity of a surface of the wafer (see Patent Literature 2).

In addition, the introduction of oxygen results in a region in which an oxygen concentration is prone to increase through heat treatment at a low temperature (e.g., 400 to 500° C.) in a device step, and an oxygen donor easily occurs, which may cause the resistivity of the region to vary. When the resistance varies, the operating voltage of a device shifts, which may cause a malfunction. In particular, in a device manufacture step of recent years, heat treatment has been performed at a lower temperature and for a shorter period with the progress of making finer devices. Therefore, some heat treatments in the device step hardly cause a change in an initial oxygen concentration distribution, which increases the risk that the influence of a variation in outer-layer oxygen concentration becomes obvious.

Furthermore, in the manufacturing method of Patent Literature 1, oxygen diffuses outward through "the rapid thermal process in a nitriding atmosphere, an Ar atmosphere, or a mixed atmosphere thereof" performed after "the rapid thermal process in an oxidizing atmosphere", which causes an oxygen concentration in a wafer outermost layer to decrease. If the oxygen concentration decreases, the mechanical strength of a portion with such an oxygen concentration decreases (see Patent Literature 3).

As seen from the above, the manufacturing method described in Patent Literature 1 can cause diverse problems due to the occurrence of regions with the increased and decreased oxygen concentrations.

Patent Literature 2 discloses "a method for manufacturing a silicon wafer, including a heat treatment step of performing rapid thermal annealing (RTA) treatment on the silicon wafer in an oxidizing atmosphere at 1250° C. or more and for 10 seconds or more, and a step of removing grown-in defects with silicon oxides region in the vicinity of an outer-layer portion of the wafer after the RTA treatment". Patent Literature 2 describes that "this method enables the manufacture of a silicon wafer that includes no COPs or dislocation clusters, and in which defects such as OSF nuclei, and oxygen precipitate nuclei existing in the $P_V$ region that do not become obvious in an as-grown state are destroyed or reduced".

However, this method cannot make the wafer include a BMD formed therein unless being further subjected to a predetermined process, and thus the wafer cannot be used in an environment where heavy metal pollution can occur.

CITATION LIST

Patent Literature

Patent Literature 1: Japanese Patent Application Publication No. 2008-207991
Patent Literature 2: Japanese Patent Application Publication No. 2010-267846
Patent Literature 3: Japanese Patent Application Publication No. 2009-170656

SUMMARY OF INVENTION

Technical Problem

The present invention has an objective to solve the previously described problems due to an increase or decrease in oxygen concentration, as well as to provide a silicon wafer that acquires a gettering ability for heavy metals in a device step, and a method for manufacturing the same.

Solution to Problem

The gist of the present invention is the silicon wafer to be described below as (1), and methods for manufacturing the silicon wafer to be described below as (2) and (3).
(1) A silicon wafer having:
an absolute value of an oxygen concentration variation rate of less than 10% in a depth direction;
a density of grown-in defects with silicon oxides of $1 \times 10^6/cm^3$ or less in an outer-layer portion that is a depth region up to at least 2 μm from a surface; and an oxygen precipitate density of $1 \times 10^8 /cm^3$ or more in a bulk portion.

In the following description, "an oxygen concentration" in a silicon wafer means "an interstitial oxygen concentration" unless otherwise noted.

In the present invention, "an oxygen concentration variation rate" is defined as a comparison between the average value of oxygen concentrations in an outermost-layer portion, in which an oxygen concentration varies by heat treatment (hereafter, referred to as "an outermost-layer oxygen concentration average"), and the average value of oxygen concentrations in a part of a bulk portion, in which an oxygen concentration does not substantially vary by the heat treatment (hereafter, referred to as "a bulk oxygen concentration average"). Specifically, it is assumed that the "outermost-layer portion" is "a depth region of up to 1 μm from the surface (a region between the surface and a depth position of 1 μm from the surface)", and the "bulk portion" is "a region deeper than a depth position of 10 m from the surface". However, in the case where the oxygen concentrations are actually measured by Secondary-Ion Mass Spectrometry (SIMS), the measurement cannot be performed accurately on a region between the surface and a depth position of less than 0.2 μm from the surface, and thus the outermost-layer portion is assumed to be a region between the depth position of 0.2 μm from the surface and a depth position of 1 μm from the surface. The oxygen concentration variation rate is defined specifically as follows.

Variation rate of oxygen concentration=(Outermost-layer oxygen concentration average−Bulk oxygen concentration average)/Bulk oxygen concentration average×100(%)

(2) A method for manufacturing a silicon wafer, including:

a growth step of growing, by the Czochralski method, a silicon single crystal ingot including no COPs or dislocation clusters;

a cut-out step of cutting out a silicon wafer from the silicon single crystal ingot;

a first heat treatment step of performing RTP treatment in which the silicon wafer is retained in an oxidizing atmosphere at a temperature of more than 1250° C. for one second or more;

an oxide film removing step of removing an oxide film that is formed in the first heat treatment step on a surface of the silicon wafer;

a second heat treatment step of performing, after performing the oxide film removing step, RTP treatment in which the silicon wafer is retained in a nitriding atmosphere or an Ar atmosphere, at 1100° C. or more for one second or more; and an oxygen concentration varying region removing step of removing, after performing the second heat treatment step, a region in the silicon wafer in which an oxygen concentration varies in the first and second heat treatment steps.

(3) A method for manufacturing a silicon wafer, including:

a growth step of growing, by the Czochralski method, a silicon single crystal ingot including no COPs or dislocation clusters;

a cut-out step of cutting out a silicon wafer from the silicon single crystal ingot;

a first heat treatment step of performing RTP treatment in which the silicon wafer is retained in an oxidizing atmosphere at a temperature of more than 1250° C. for one second or more;

an increased-oxygen-concentration region removing step of removing a region in the silicon wafer in which an oxygen concentration increases in the first heat treatment step;

a second heat treatment step of performing, after performing the increased-oxygen-concentration region removing step, RTP treatment in which the silicon wafer is retained in a nitriding atmosphere or an Ar atmosphere, at 1100° C. or more for one second or more; and a decreased-oxygen-concentration region removing step of removing, after performing the second heat treatment step, a region in the silicon wafer in which an oxygen concentration decreases in the second heat treatment step.

Advantageous Effects of Invention

With the silicon wafer according to the present invention, since the absolute value of the oxygen concentration variation rate in the depth direction is less than 10%, it is possible, in low-temperature heat treatment in a device step, to prevent an oxygen donor of the extent that the fluctuation in resistance value becomes a problem from occurring even in a portion having a high oxygen concentration. In addition, it is possible to increase the strength of such a wafer even in a portion having a low oxygen concentration. Furthermore, since the oxygen concentration variation rate in the depth direction is low, the silicon wafer according to the present invention is applicable in various heat treatment conditions in a device step.

Since the density of grown-in defects with silicon oxides is $1 \times 10^6 /cm^3$ or less in the outer-layer portion, which is a depth region up to at least 2 μm from the surface, it is possible to provide better properties of a device formed in a region including this outer-layer portion and also to support finer devices.

Since the oxygen precipitate density in the bulk portion is $1 \times 10^8 /cm^3$ or more, it is possible to provide a sufficient gettering effect for heavy metals in a device step.

The silicon wafer according to the present invention can be manufactured by the method for manufacturing a silicon wafer according to the present invention.

DESCRIPTION OF EMBODIMENTS

A silicon wafer according to the present invention is characterized in that the absolute value of an oxygen concentration variation rate in a depth direction is less than 10%, the density of grown-in defects with silicon oxides is $1 \times 10^6 /cm^3$ or less in an outer-layer portion, which is a depth region up to at least 2 μm from the surface thereof, and an oxygen precipitate density in a bulk portion is $1\times10^8/cm^3$ or more.

Since the absolute value of the oxygen concentration variation rate in the depth direction is less than 10%, it is possible, in low-temperature heat treatment in a device step, to prevent an oxygen donor of the extent that a fluctuation in resistance value becomes a problem from occurring even in a portion having a high oxygen concentration. Therefore, it is possible to prevent the operating voltage of a device from shifting due to a fluctuation in resistance value. In addition, since the absolute value of the oxygen concentration variation rate in the depth direction is less than 10%, it is possible to increase the strength of such a wafer even in a portion having a low oxygen concentration.

Device thermal processes differ according to device manufacturers and final device products. For this reason, if the oxygen concentration in a silicon wafer in the depth direction varies, it is difficult to predict an influence of a device thermal process on properties. As for the silicon wafer according to the present invention, it is easy to predict such an influence since the absolute value of the oxygen concentration variation rate in the depth direction is less than 10%.

In order to obtain the previously-described effects sufficiently, it is desirable that the absolute value of the oxygen concentration variation rate in the depth direction is less than 5%.

Since the density of grown-in defects with silicon oxides is $1\times10^6/cm^3$ or less in the outer-layer portion, which is a depth region up to 2 μm from the surface, it is possible to provide better properties of a device formed in a region including this outer-layer portion and also to support finer devices.

In order to obtain the same effects as the above even when a device is formed up to a deeper region, the above-described outer-layer portion (a region having a density of grown-in defects with silicon oxides of $1\times10^6/cm^3$ or less) is desirably made to be a depth region up to 5 μm from the surface, more desirably a depth region up to 10 μm from the surface. It is desirable to set the depth region of the above-described outer-layer portion to include a region in which a depletion layer is formed in a device.

Since the density of oxygen precipitate (BMD) in the bulk portion is $1\times10^8/cm^3$ or more, this wafer has a sufficient gettering effect for heavy metals in a device step. The oxygen precipitate density in the bulk portion can be measured in the following manner. First, heat treatment for evaluation is performed on a silicon wafer. The heat treatment for evaluation can be performed as a two-stage heat treatment including a heat treatment at 800° C.×4 hours followed by a heat treatment at 1000° C.×16 hours. Afterward, this silicon wafer is cleaved and subjected to Secco etching at room temperature for two minutes. An etchant used in the Secco etching has a selectivity for oxygen precipitate (BMD). Then, a cleavage plane having been subjected to this treatment is observed under an optical microscope, and a density in an etch pit is measured. This density can be considered to be an oxygen precipitate density.

The silicon wafer according to the present invention desirably has an oxygen concentration of $8\times10^{17}$ to $14\times10^{17}/cm^3$. This enables the suppression of grown-in defects in the outer-layer portion to be a device active region and enables the formation of sufficient BMDs enough to capture heavy metal impurities in the bulk portion while minimizing the occurrence of an oxygen donor with the strength of the outer-layer portion maintained.

A method for manufacturing a silicon wafer according to the present invention is a method by which the above-described silicon wafer according to the present invention can be manufactured, the method having the following feature (A) or (B).

(A) A method including:
a growth step of growing, by the Czochralski method, a silicon single crystal ingot including no COPs or dislocation clusters;
a cut-out step of cutting out a silicon wafer from the silicon single crystal ingot;
a first heat treatment step of performing RTP treatment in which the silicon wafer is retained in an oxidizing atmosphere at a temperature of more than 1250° C. for one second or more;
an oxide film removing step of removing an oxide film that is formed in the first heat treatment step on a surface of the silicon wafer;
a second heat treatment step of performing, after performing the oxide film removing step, RTP treatment in which the silicon wafer is retained in a nitriding atmosphere or an Ar atmosphere, at 1100° C. or more for one second or more; and
an oxygen concentration varying region removing step of removing, after performing the second heat treatment step, a region in the silicon wafer in which an oxygen concentration varies in the first and second heat treatment steps.

(B) A method including:
a growth step of growing, by the Czochralski method, a silicon single crystal ingot including no COPs or dislocation clusters;
a cut-out step of cutting out a silicon wafer from the silicon single crystal ingot;
a first heat treatment step of performing RTP treatment in which the silicon wafer is retained in an oxidizing atmosphere at a temperature of more than 1250° C. for one second or more;
an increased-oxygen-concentration region removing step of removing a region in the silicon wafer in which an oxygen concentration increases in the first heat treatment step;
a second heat treatment step of performing, after performing the increased-oxygen-concentration region removing step, RTP treatment in which the silicon wafer is retained in a nitriding atmosphere or an Ar atmosphere, at 1100° C. or more for one second or more; and
a decreased-oxygen-concentration region removing step of removing, after performing the second heat treatment step, a region in the silicon wafer in which an oxygen concentration decreases in the second heat treatment step.

Hereafter, each step will be described in detail.

(a) Growth Step of Silicon Single Crystal Ingot

This is a step of growing a silicon single crystal ingot by the CZ method. In the growth, it is desirable to use a single crystal pulling apparatus that has a hot-zone structure configured to obtain a proper temperature gradient in the growth direction of the single crystal immediately after pulling. In this case, crystal defects can be controlled by performing the crystal growth at a proper pulling speed. As a specific method to control the crystal defects by setting a temperature gradient and a pulling speed, for example, the method described in Patent Literature 2 described above can be employed.

(b) Cut-Out Step of Silicon Wafer

This is a step of cutting out a silicon wafer from the silicon single crystal ingot. In this step, an ingot is typically cut into a number of blocks, which are identified according to their electric resistances, and made into wafers after slicing, lapping, chemical etching, mirror polish, and the other treatment. All the treatment may be performed according to methods conventionally practiced.

(c) First Heat Treatment Step

This is a step of performing RTP treatment in which the silicon wafers having been cut out in the cut-out step are retained in an oxidizing atmosphere at a temperature more than 1250° C. for one second or more.

The reason for performing this RTP treatment in the oxidizing atmosphere is to destroy or reduce defects such as sheet-shaped oxygen precipitates (OSF nuclei) existing in an OSF region and oxygen precipitate nuclei existing in a $P_V$ region. Operational advantages of the RTP treatment will be described below.

A silicon single crystal grown by the CZ method typically contains oxygen of the order of $10^{18}$ atoms/cm$^3$ as an impurity. This oxygen is dissolved in the silicon crystal at temperatures near the fusing point of silicon, specifically exists between silicon crystal lattices. However, in a wafer that is cut out from the silicon single crystal and lies at temperatures near room temperature, part of the oxygen is precipitated as a silicon oxide ($SiO_2$), forming crystal defects such as OSF nuclei and oxygen precipitate nuclei in a $P_V$ region.

When this wafer is subjected to the RTP treatment in an oxidizing atmosphere, silicon oxide in a crystal defect inside the wafer is destroyed by the movement of oxygen atoms making up the silicon oxide into a crystal lattice. The destroyed silicon oxide is replaced by vacancies. Since the RTP treatment is performed in the oxidizing atmosphere, interstitial silicon is injected from a surface side of the wafer, with which the vacancies are embedded. This series of processes is recognized as a melting (dissolution) phenomenon. As a result, grown-in defects with silicon oxides such as OSF nuclei and oxygen precipitate nuclei in a $P_V$ region are destroyed or reduced. If COPs, such as microfine COPs, are included, they are also destroyed or reduced.

As the oxidizing atmosphere, for example, an atmosphere of gas including one or more kinds selected from the group consisting of $O_2$, $O_3$, and $H_2O$ (steam) can be employed. In order to enhance the effect of removing $SiO_2$ in the crystal defect, it is desirable that one or more kinds selected from the group consisting of $O_2$, $O_3$, and $H_2O$ account for 100% of the oxidizing atmosphere. However, the oxidizing atmosphere is not limited to this and may be, for example, an atmosphere of mixed gas of one or more kinds selected from the group consisting of $O_2$, $O_3$, and $H_2O$, and inert gas.

The reason for performing the RTP treatment at a temperature more than 1250° C. is that a treatment temperature of 1250° C. or less results in an insufficient effect of the destruction and removal, or reduction of the crystal defect. Since a wafer melts at temperatures more than the fusing point of silicon (1410° C.), it is desirable to set the upper limit of the treatment temperature to 1400° C. If the treatment temperature is relatively high even at or below 1400° C., a slip dislocation is prone to be introduced into the wafer, and in addition high loads are imposed to an apparatus. Therefore, it is desirable to set the upper limit of the temperature to 1350° C.

The reason for setting the retention time at the treatment temperature (a temperature more than 1250° C.) to one second or more is that a retention time of less than one second results in an insufficient effect of removing the crystal defect. It is desirable to set the upper limit of the treatment period to, although depending on the treatment temperature, 60 seconds from the viewpoint of reducing the occurrence of slip.

A temperature rise/drop rate in the RTP treatment is set within a range from 10° C./s to 300° C./s. A temperature rise/drop rate of less than 10° C./s results in a significant decline in productivity, and a temperature rise/drop rate of 300° C./s is the heating limit of current RTP devices. In order to suppress the occurrence of slip in a wafer and secure the reproducibility of temperature control, it is more desirable to control the temperature rise/drop rate to 150° C./s or less. For the RTP treatment, it is desirable to use a lamp anneal furnace by which rapid temperature rise and rapid temperature drop can be performed. Use of a lamp anneal furnace enables the treatment to be performed without giving an excessive heat quantity to a wafer.

(d) Oxide Film Removing Step

This is a step of removing an oxide film that is formed on a surface of the silicon wafer in the first heat treatment step. Since the first heat treatment step is performed in the oxidizing atmosphere, an oxygen concentration in a region in the vicinity of the surface of the silicon wafer increases. Such a region includes an oxide film in a wafer outermost layer, and a region that is a layer lower than the oxide film in which oxygen is dissolved in a silicon crystal or exists as precipitated oxides. Among them, what is to be removed in the present step is the oxide film.

The oxide film is extremely thin as compared with the entire region in which the oxygen concentration increases by performing the first heat treatment step. For this reason, the thickness of the entire region is not changed substantially by performing the oxide film removing step.

The oxide film can be removed by, for example, etching with hydrofluoric acid (HF) solution.

(e) Increased-Oxygen-Concentration Region Removing Step

This is a step of removing a region in the silicon wafer in which the oxygen concentration increases in the first heat treatment step (hereafter, referred to as an "increased-oxygen-concentration region"). In the present step, the entire increased-oxygen-concentration region, including the oxide film, is removed.

By removing the increased-oxygen-concentration region, oxygen concentrations in the remaining portion of the wafer are made substantially constant in the depth direction of the wafer. The determination of what range in the vicinity of the surface of the wafer is considered to be a region in which the oxygen concentration increases in the first heat treatment step can be made such that, in the remaining portion of the wafer, the absolute value of an oxygen concentration variation rate in the depth direction (the variation rate of the oxygen concentration in the outermost-layer portion (a region between the surface and a depth position of 1 μm from the surface) with respect to the oxygen concentration in the bulk portion in which the oxygen concentration does not substantially vary (a region deeper than a depth position of 10 μm from the surface)) becomes, for example, less than 10% (e.g., less than 5% as necessary).

The oxide film in the increased-oxygen-concentration region can be removed by the same method as that in the oxide film removing step described above.

The increased-oxygen-concentration region is removed by machining or chemical reaction. Any method is applicable as long as the method can remove this region with no influence on the flatness of the wafer and with a sufficiently minor machining damage. As the machining, grinding processing, polishing processing, or the like can be employed.

From the viewpoint of minimizing the machining damage, employing the polishing processing is desirable. As the chemical reaction, acid etching, alkali etching, or the like can be employed. In addition, the machining and the chemical reaction can be performed in combination.

(f) Second Heat Treatment Step

This is a step of, after performing the oxide film removing step or the increased-oxygen-concentration region removing step, performing RTP treatment in which the silicon wafer is retained in a nitriding atmosphere or an Ar atmosphere at 1100° C. or more and for one second or more.

Through this step, BMD nuclei are formed. When the treatment temperature is less than 1100° C., the BMD nuclei are not formed at a sufficiently high density. A higher treatment temperature results in the formation of the BMD nuclei at a higher density, which is preferable for capturing heavy metal impurities. On the other hand, when the treatment temperature is more than 1300° C., the interstitial oxygen having diffused into the outer layer in the first heat treatment step may diffuse more deeply in the wafer, widening the region to be removed in an oxygen concentration varying region removing step performed afterward. In this case, the productivity declines. In addition, when the treatment temperature is more than 1300° C., oxygen precipitates occurs in a 2-μm region in the outer layer. If an oxide film is formed on such a region in the device step, the dielectric voltage of the oxide film decreases. For this reason, it is desirable to set the upper limit of the treatment temperature to 1300° C.

As the nitriding atmosphere, for example, an atmosphere of gas including one or more kinds selected from the group consisting of a nitrogen ($N_2$) and an ammonia ($NH_3$) can be employed. The one or more kinds selected from the group consisting of $N_2$ and $NH_3$ may account for 100% of the nitriding atmosphere, or the nitriding atmosphere may be an atmosphere of mixed gas of one or more kinds selected from the group consisting of $N_2$ and $NH_3$ and inert gas (e.g., Ar).

The temperature drop rate of the second heat treatment step is set to, for example, 10° C./s or more, more desirably 50° C./s or more. This enables an increased BMD density. If the temperature drop rate is less than 10° C./s, the BMD nuclei cannot be formed efficiently.

(g) Oxygen Concentration Varying Region Removing Step

This is a step of removing, after performing the second heat treatment step, a region of the silicon wafer in which the oxygen concentration varies in the first and second heat treatment steps (hereafter, referred to as an "oxygen concentration varying region"), the silicon wafer having been subjected to the oxide film removing step (the increased-oxygen-concentration region removing step is not performed thereon).

The performance of the first heat treatment step makes the oxygen concentration in the vicinity of the surface of the wafer increase. In contrast, the performance of the second heat treatment step makes the oxygen concentration in the vicinity of the surface of the wafer decrease. In such a manner, the performance of the first and second heat treatment steps results in a region in which the oxygen concentration varies as compared with that before the performance of the first heat treatment step. Such a region is removed in the present step.

By removing the oxygen concentration varying region, oxygen concentrations in the remaining portion of the wafer are made substantially constant in the depth direction of the wafer. The determination of what range in the vicinity of the surface of the wafer is considered to be a region in which the oxygen concentration varies in the first and second heat treatment steps can be made such that the absolute value of the oxygen concentration variation rate of the remaining portion of the wafer becomes less than 10%, more desirably less than 5%.

The removal of the oxygen concentration varying region can be performed by mechanical polishing.

The performance of the second heat treatment step generates a region, in the outermost-layer portion of the wafer, in which an oxygen concentration decreases as compared with that in the deeper portion of the wafer. Such a region has a decreased mechanical strength, and by performing the oxygen concentration varying region removing step, it is possible to maintain the mechanical strength of the remaining portion of the wafer at the same level before the heat treatment.

(h) Decreased-Oxygen-Concentration Region Removing Step

This is a step of, after performing the second heat treatment step, removing a region of the silicon wafer in which the oxygen concentration decreases in the second heat treatment step (hereafter, referred to as a "decreased-oxygen-concentration region"), the silicon wafer having been subjected to the increased-oxygen-concentration region removing step. Since the second heat treatment step is performed in the nitriding atmosphere or the Ar atmosphere, the performance of the second heat treatment step makes the oxygen concentration in the vicinity of the surface of the wafer decrease.

As previously described, the oxygen concentrations are substantially constant in the depth direction of the wafer after performing the increased-oxygen-concentration region removing step and before performing the second heat treatment step. Therefore, by removing the decreased-oxygen-concentration region, the oxygen concentrations in the remaining portion of the wafer are made substantially constant in the depth direction of the wafer. The determination of what range in the vicinity of the surface of the wafer is considered to be a region in which the oxygen concentration decreases in the second heat treatment step can be made such that the oxygen concentration variation rate of the remaining portion of the wafer becomes less than 10%, more desirably less than 5%.

The removal of the decreased-oxygen-concentration region can be performed by mechanical polishing.

The region generated by performing the second heat treatment step, having a decreased oxygen concentration, may have a decreased mechanical strength. Since such a region is removed by performing the decreased-oxygen-concentration region removing step, the remaining portion of the wafer has a high mechanical strength.

Figure 3:
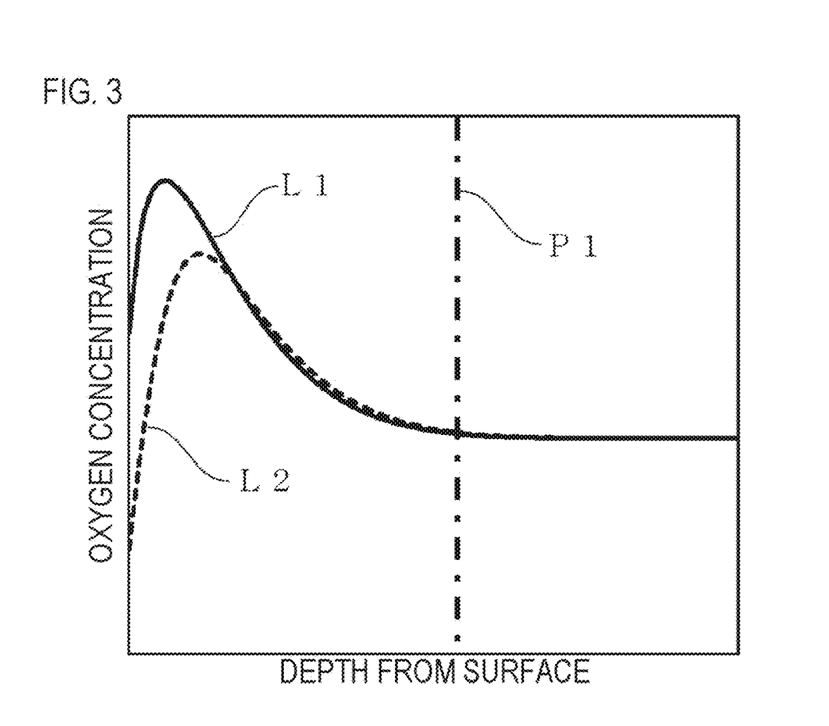
FIG. 3 is a diagram illustrating a change in oxygen concentration profile of a wafer at the time of performing a method for manufacturing a silicon wafer according to the present invention including an oxide film removing step and an oxygen concentration varying region removing step.

FIG. 3 illustrates a change in oxygen concentration profile of a wafer at the time of performing a method for manufacturing a silicon wafer according to the present invention, having the above-described feature (A). In FIG. 3, the abscissa axis represents depth from the surface of the wafer, and the ordinate axis represents oxygen concentration. Referring to FIG. 3, there will be described the change in oxygen concentration profile (the relation between the depth from the surface and the oxygen concentration) at the time of performing the method for manufacturing a silicon wafer according to the present invention, having the above-described feature (A).

After performing the cut-out step and before performing the first heat treatment step, the oxygen concentrations are substantially constant in the depth direction of the wafer (the absolute value of an oxygen concentration variation rate is less than 10%, desirably less than 5%), for example, the order of 1×10$^{18}$ atoms/cm$^3$. By performing the first heat treatment step, for example, in an O$_2$ atmosphere and in a condition of 1350° C.×10 seconds, oxygen is introduced into the silicon wafer from the surface of the wafer, increasing the oxygen concentration in the vicinity of the surface of the wafer, as illustrated by a curve (solid line) L1 in FIG. 3.

Afterward, in the manufacturing method according to the present invention, the oxide film is removed (the oxide film removing step). The thickness of the oxide film is 100 to 300 Å, which is extremely thin as compared with 3 to 10 µm that is the thickness of the entire region in which the oxygen concentration is increased by performing the first heat treatment step. For this reason, even when the oxide film is removed, the thickness of the entire region is not changed substantially.

Next, by performing the second heat treatment step, for example, in a mixed gas atmosphere of NH$_3$ and Ar and in the condition of 1150° C.×10 seconds, the oxygen concentration in the vicinity of the surface of the wafer decreases, as illustrated by a curve (broken line) L2 in FIG. 3. In the outermost-layer portion of the wafer, a region is generated in which the oxygen concentration decreases as compared with that before performing the first heat treatment step. When the second heat treatment step is performed at a temperature lower than that in the first heat treatment step, the thickness of a region in which the oxygen concentration decreases in the second heat treatment step is small as compared with the thickness of a region in which the oxygen concentration increases in the first heat treatment step. Therefore, the thickness of the oxygen concentration varying region is substantially equal to the thickness of the increased-oxygen-concentration region. When the second heat treatment step is performed at a temperature higher than that in the first heat treatment step, the interstitial oxygen having diffused in the first heat treatment step diffuse more deeply, and thus the thickness of the increased-oxygen-concentration region is larger than that after performing the first heat treatment step.

Next, the oxygen concentration varying region (a region shallower than a depth position illustrated by a dash-dot line P1 in FIG. 3) is removed (the oxygen concentration varying region removing step). This makes the oxygen concentrations in the remaining portion of the wafer substantially constant in the depth direction of the wafer. A removal thickness of the wafer outer layer portion (the thickness of a region to be removed from the wafer outer layer portion) can be determined in advance by any one of the following methods (i) to (iii).

(i) The removal of the wafer outer layer portion is performed with different removal thicknesses to conduct an experiment to measure the oxygen concentration variation rate of the remaining portion of the wafer.
(ii) A depth-direction profile of oxygen is calculated based on the thermal profile (including a temperature rise/drop profile) in the first and second heat treatment steps to determine the thickness of the oxygen concentration varying region.
(iii) An oxygen diffusion length is calculated based on a maximum temperature and a retention period at the temperature in each of the first and second heat treatment steps to determine the thickness of the oxygen concentration varying region (a method for performing the calculation of the above method (ii) in a simple manner).

The oxygen concentration profile illustrated by the curve L2 in FIG. 3 is determined by the above method (ii).

Figure 4:
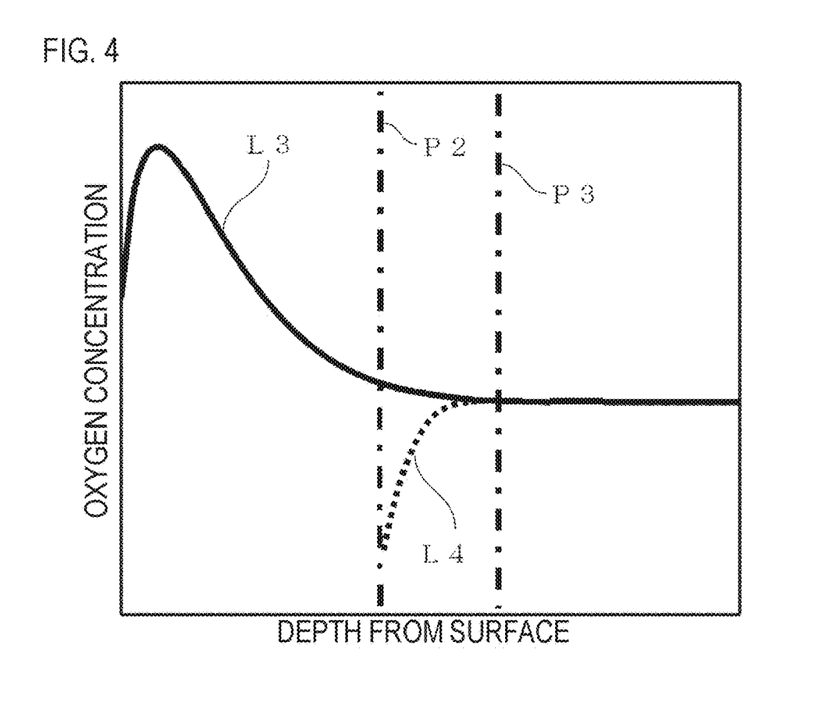
FIG. 4 is a diagram illustrating a change in oxygen concentration profile of a wafer at the time of performing a method for manufacturing a silicon wafer according to the present invention including an increased-oxygen-concentration region removing step and a decreased-oxygen-concentration region removing step.

FIG. 4 illustrates a change in oxygen concentration profile of a wafer at the time of performing a method for manufacturing a silicon wafer according to the present invention, having the above-described feature (B). In FIG. 4, the abscissa axis represents depth from the surface of the wafer, and the ordinate axis represents oxygen concentration. Referring to FIG. 4, there will be described the oxygen concentration profile at the time of performing the method for manufacturing a silicon wafer according to the present invention, having the above-described feature (B).

After performing the cut-out step and before performing the first heat treatment step, the oxygen concentrations are substantially constant in the depth direction of the wafer (the absolute value of an oxygen concentration variation rate is less than 10%, desirably less than 5%). By performing the first heat treatment step, for example, in an O$_2$ atmosphere and in a condition of 1350° C.×10 seconds, oxygen is introduced into the silicon wafer from the surface of the wafer, increasing the oxygen concentration in the vicinity of the surface of the wafer, as illustrated by a curve (solid line) L3 in FIG. 4.

Afterward, in the manufacturing method according to the present invention, the increased-oxygen-concentration region (a depth region shallower than a depth position illustrated by a dash-dot line P2 in FIG. 4) is removed (the increased-oxygen-concentration region removing step). This makes the oxygen concentrations in the remaining portion of the wafer substantially constant in the depth direction of the wafer (e.g., the variation in the oxygen concentrations being less than 10%/o). A removal thickness of the wafer can be determined in advance by any one of the following methods (iv) to (vi).
(iv) The removal of the wafer outer layer portion is performed with different removal thicknesses to conduct an experiment to measure the oxygen concentration variation rate of the remaining portion of the wafer.
(v) A depth-direction profile of oxygen is calculated based on the thermal profile (including a temperature rise/drop profile) in the first heat treatment step to determine the thickness of the increased-oxygen-concentration region.
(vi) An oxygen diffusion length is calculated based on a maximum temperature and a retention period at the temperature in the first heat treatment step to determine the thickness of the increased-oxygen-concentration region (a method for performing the calculation of the above (v) in a simple manner).

The oxygen concentration profile illustrated by the curve L3 in FIG. 4 is determined by the above method (v).

Next, by performing the second heat treatment step, for example, in a mixed gas atmosphere of NH$_3$ and Ar and in the condition of 1150° C.×10 seconds, the oxygen concentration in the vicinity of the surface of the wafer decreases, as illustrated by a curve (dotted line) L4 in FIG. 4. Since the region having an oxygen concentration increased in the first heat treatment step has been already removed, the region having an oxygen concentration higher than that before performing the first heat treatment step is substantially absent after performing the second heat treatment step.

Next, the decreased-oxygen-concentration region (a region, in FIG. 4, between the depth position illustrated by the dash-dot line P2 (the surface) and a depth position illustrated by a dash-dot line P3) is removed (the decreased-oxygen-concentration region removing step). This makes the oxygen concentrations in the remaining portion of the wafer substantially constant in the depth direction of the wafer. A removal thickness of the wafer can be determined in advance by any one of the following methods (vii) to (ix).
(vii) The removal of the wafer outer layer portion is performed with different removal thicknesses to conduct an experiment to measure the oxygen concentration variation rate of the remaining portion of the wafer.

(viii) A depth-direction profile of oxygen is calculated based on the thermal profile (including a temperature rise/drop profile) in the second heat treatment step to determine the thickness of the decreased-oxygen-concentration region.

(ix) An oxygen diffusion length is calculated based on a maximum temperature and a retention period at the temperature in the second heat treatment step to determine the thickness of the decreased-oxygen-concentration region (a method for performing the calculation of the above (viii) in a simple manner).

The oxygen concentration profile illustrated by the curve L4 in FIG. 4 is determined by the above method (viii).

In order to increase the productivity, it is desirable in the oxygen concentration varying region removing step, the increased-oxygen-concentration region removing step, and the decreased-oxygen-concentration region removing step to set the amount of removal of the wafer as small as possible to shorten the times taken for these removing steps, as long as the variation in oxygen concentration of the remaining portion after the removal is at acceptable levels.

Comparing the maximum values of BMD density profile after the heat treatment for BMD evaluation with the treatment temperature in the second heat treatment step unchanged, the maximum value is, for example, $6.1 \times 10^9/cm^3$ for the wafer obtained by the manufacturing method having the above-described feature (A), while, for example, $1.2 \times 10^{10}/cm^3$ for the wafer obtained by the manufacturing method having the above-described feature (B). That is, as compared with the manufacturing method having the above-described feature (A), the manufacturing method having the above-described feature (B) can provide a wafer having a higher BMD density. In the case where a higher BMD density is needed, or where proximity gettering is needed at a position closer to a device active region, it is more effective to use the manufacturing method having the above-described feature (B).

The above-described silicon wafer according to the present invention can be manufactured by the method for manufacturing a silicon wafer according to the present invention.

EXAMPLES

Example A

Silicon wafers were manufactured by the manufacturing method according to the present invention having the above-described feature (A), in the conditions shown in Examples 1 and 2 in Table 1, to investigate oxygen concentration profiles in the depth direction of the wafers and densities of grown-in defects with silicon oxides. The manufacture conditions of the wafers are as follows.

First, wafers were obtained by slicing a silicon single crystal ingot grown by the CZ method. The obtained wafers consisted of a defect-free region including no COPs or dislocation clusters but included OSF (C-OSF3) defects. As the wafers, two kinds of wafers having different oxygen concentrations were prepared. The oxygen concentration of one wafer (hereafter, referred to as a "wafer A") was $9.9 \times 10^{17}$ atoms/cm$^3$, and the oxygen concentration of the other wafer (hereafter, referred to as a "wafer B") was $12.1 \times 10^{17}$ atoms/cm$^3$. These two kinds of wafers were each subjected to the following steps.

These wafers were lapped, subjected to chamfering processing. Thereafter, their surfaces were ground, and the wafers were etched for strain removal.

As the first heat treatment step, these wafers were subjected to RTA treatment in an atmosphere of 100% $O_2$, at 1325° C.×10 seconds. The thickness of an oxide film formed by this treatment was 173 Å. As the oxide film removing step, the oxide film was removed by etching with hydrofluoric acid solution.

Next, as the second heat treatment step, these wafers were subjected to RTA treatment at 1175° C.×10 seconds, in a nitriding atmosphere, specifically, in the flows of $NH_3$ and Ar at flow rates of 3 slm (Standard Liter/minute) and 17 slm, respectively. At this point, the temperature rise rate was set to 50° C./s, and the temperature drop rate was set to 70° C./s. It was confirmed that the BMD density changed with a change in the temperature drop rate. Specifically, when the temperature drop rate was set to less than 10° C./s, the BMD density decreased.

Afterward, as the oxygen concentration varying region removing step, a region having an oxygen concentration varied in the first and second heat treatment steps was removed by double-side polishing and single-side polishing. By setting the thickness of the region to be removed to 6 μm or more, the region having a varied oxygen concentration could be removed substantially entirely.

Figure 5:
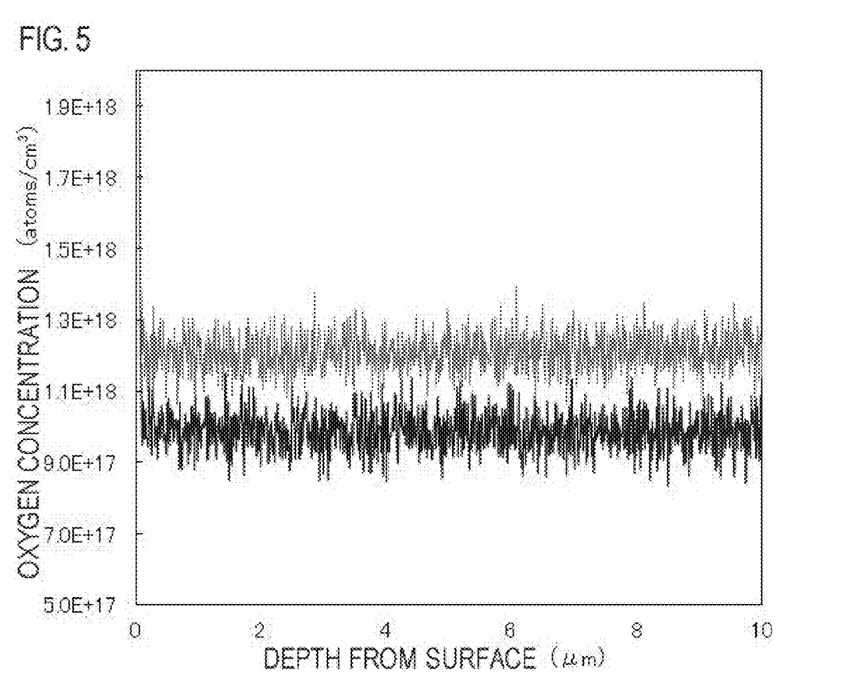
FIG. 5 is an oxygen concentration profile of a silicon wafer in an example according to the present invention.

FIG. 5 illustrates the oxygen concentration profile of the wafer obtained in such a manner. The oxygen concentrations were measured by SIMS. The oxygen concentrations were substantially constant in the depth direction, and the absolute value of the variation rate thereof was less than 10%.

In more detail, in the wafer obtained by the treatment of the wafer A, the average value of oxygen concentrations was $1.0 \times 10^{18}$ atoms/cm$^3$ in a depth region of 0.1 to 1.0 μm from its surface (the outermost-layer portion), and was $9.9 \times 10^{17}$ atoms/cm$^3$ in a region at depths of 10 μm or more from its surface (the bulk portion). Therefore, the oxygen concentration variation rate resulting from the treatment of the wafer A (Outermost-layer oxygen concentration average−Bulk oxygen concentration average)/Bulk oxygen concentration average×100(%)) was 1%.

In the wafer obtained by the treatment of the wafer B, the average value of oxygen concentrations was $1.22 \times 10^{18}$ atoms/cm$^3$ in a depth region of 0.1 to 1.0 μm from its surface, and was $1.21 \times 10^{18}$ atoms/cm$^3$ in a region at depths of 10 μm or more from its surface. Therefore, the oxygen concentration variation rate resulting from the treatment of the wafer B was 0.8%.

When the heat treatment temperature was high or the heat treatment period was long as compared to 1325° C.×10 seconds, which is the RTA treatment condition of the above-described first heat treatment step, a region having a varied oxygen concentration could be removed substantially entirely by setting a larger thickness of the region to be removed (more than 6 μm).

Evaluating the wafer obtained by the above treatment, the density of grown-in defects with silicon oxides was under the detection limits ($1 \times 10^5/cm^3$) in the outer-layer region up to 5 μm from the surface of the wafer. In addition, as the heat treatment for evaluation, this wafer was subjected to heat treatment in an atmosphere of 3% $O_2$/97% $N_2$, at 800° C.×4 hours, and further subjected to heat treatment in a $N_2$ atmosphere at 1000° C.×16 hours. The BMD density of the entire surface of the wafer after this heat treatment for evaluation was about $6 \times 10^9/cm^3$ for the wafer obtained by the treatment of the wafer A and was about $6 \times 10^{10}/cm^3$ for the wafer obtained by the treatment of the wafer B. By the time dependent dielectric breakdown (TZDB) test, the GOI property was evaluated to be 100%, which was good.

For each case, an investigation was performed on the presence/absence of "grown-in defects with silicon oxides" that become obvious on the surface of the wafer by reactive ion etching, with different thicknesses of the region to be removed. As a result, it was often the case where grown-in defects with silicon oxides remained ($1\times10^5/cm^3$ or more) when the region having a varied oxygen concentration could not be removed substantially entirely.

For example, as to the wafer A, when the thickness of a region to be removed in the above-described polishing step was set to 2 μm, the density of grown-in defects with silicon oxides was $4.5\times10^6/cm^3$. In this case, the average value of oxygen concentrations in a depth region of 0.1 to 1.0 μm from the surface was $14.1\times10^{17}$ atoms/cm$^3$, which was high as compared with the oxygen concentration in a region at depths of 10 μm or more from the surface.

In addition, when polishing was not performed after performing the second heat treatment step, the reduction of grown-in defects with silicon oxides failed, and moreover the GOI property deteriorated under the influence of nitriding in the second heat treatment step.

According to the investigation described above, it was confirmed that, by selecting a suitable amount of polishing, it is possible to make oxygen concentrations in the depth direction of a wafer substantially constant as well as to reduce the grown-in defects with silicon oxides significantly, even when the heat treatment in an oxidizing atmosphere and the heat treatment in a nitriding atmosphere are performed.

Example B

As examples of the present invention, silicon wafers were manufactured in the conditions shown in Examples 3, 4, and 5 in Table 1. Besides, as a manufacturing method not satisfying the requirements of the present invention, a silicon wafer was manufactured in the condition shown in Comparative Example 1 in Table 1.

The wafers to be subjected to the treatment (material wafers) were a wafer including a $P_V$ region and a $P_I$ region ($P_V/P_I$ mixture), and wafers including an OSF region, a $P_V$ region, and a $P_I$ region (OSF/$P_V$/$P_I$ mixture), which were prepared based on crystal defects included therein. In addition, the material wafers were those having an oxygen concentration (interstitial oxygen concentration Oi) of $9.60\times10^{17}$ atoms/cm$^3$, $9.90\times10^{17}$ atoms/cm$^3$, $1.21\times10^{18}$ atoms/cm$^3$, or $1.35\times10^{18}$ atoms/cm$^3$.

The term "Removal 1" in Table 1 is the step of removing the wafer outer-layer portion after performing the first heat treatment step, and for wafers subjected to this step, the removal thickness in this step is shown in the column of "Removal 1". It is noted that, even on wafers shown as "No" in "Removal 1", the second heat treatment step was performed after an oxide film was removed. The term "Removal 2" in Table 1 is the step of removing the wafer outer-layer portion after performing the second heat treatment step, the removal thickness in this step is shown in the column of "Removal 2".

Table 1 shows, as the result of evaluation of the obtained wafers:
(a) Maximum value of densities of grown-in defects with silicon oxides in the outer-layer portion that is a depth region of up to 5 μm from the surface (Grown-in defect density (maximum value));
(b) Maximum value of oxygen precipitate densities in the bulk portion (BMD density (maximum value)); and
(c) Absolute value of oxygen concentration variation rate (Surface oxygen concentration variation rate (absolute value)).

From this result, it is understood that, by selecting appropriate removal thicknesses in "Removal 1" and "Removal 2" in accordance with the treatment temperatures of the first and second heat treatment steps, it is possible to obtain wafers having grown-in defect densities of $1\times10^5/cm^3$ (detection limit: D.L.) or less and surface oxygen concentration variation rates of less than 10%. In addition, it is understood that, by selecting the treatment condition appropriately, it is possible to make a grown-in defect density of $1\times10^6/cm^3$ or less even when a material wafer includes an OSF region.

INDUSTRIAL APPLICABILITY

The silicon wafer according to the present invention includes very few grown-in defects with silicon oxides, and thus when the silicon wafer is used as a substrate of a semiconductor device, there is no risk of bringing about an adverse effect such as a poor property of the device. In addition, this wafer includes BMDs at a sufficient density to capture heavy metals in a device step. Therefore, this wafer

TABLE 1

| | Material Wafer | | Processing Condition | | | | Result | | |
|---|---|---|---|---|---|---|---|---|---|
| | In-Plane Crystalline Region | Oi atoms/cm$^3$ | First Heat Treatment Step | Removal 1 | Second Heat Treatment Step | Removal 2 | Grown-In Defect Density (Maximum Value) | BMD Density (Maximum Value) | Surface Oxygen Concentration Variation Rate (Absolute Value) |
| Example 1 | OSF/$P_V$/$P_I$ Mixture | 9.90E+17 | 1325° C. × 10 sec O$_2$ | No | 1175° C. × 10 sec NH$_3$/Ar | 6 μm | ≤1E+5/cm$^3$ (D.L.) | 6.1E+9/cm$^3$ | 1% |
| Example 2 | OSF/$P_V$/$P_I$ Mixture | 1.21E+18 | 1325° C. × 10 sec O$_2$ | No | 1175° C. × 10 sec NH$_3$/Ar | 6 μm | ≤1E+5/cm$^3$ (D.L.) | 5.8E+10/cm$^3$ | 0.8% |
| Example 3 | $P_V$/$P_I$ Mixture | 9.60E+17 | 1260° C. × 10 sec O$_2$ | No | 1125° C. × 10 sec NH$_3$/Ar | 3 μm | ≤1E+5/cm$^3$ (D.L.) | 5.6E+8/cm$^3$ | 3% |
| Example 4 | OSF/$P_V$/$P_I$ Mixture | 1.35E+18 | 1300° C. × 10 sec O$_2$ | No | 1150° C. × 10 sec NH$_3$/Ar | 4 μm | 9.2E+5/cm$^3$ | 2.2E+10/cm$^3$ | 1% |
| Example 5 | OSF/$P_V$/$P_I$ Mixture | 9.90E+17 | 1350° C. × 10 sec O$_2$ | 4 μm | 1175° C. × 10 sec NH$_3$/Ar | 2 μm | 1E+5/cm$^3$ (D.L.) | 1.2E+10/cm$^3$ | 2% |
| Comparative Example 1 | OSF/$P_V$/$P_I$ Mixture | 9.90E+17 | 1325° C. × 10 sec O$_2$ | No | 1175° C. × 10 sec NH$_3$/Ar | 2 μm | 4.5E+6/cm$^3$* | 7.5E+9/cm$^3$ | 42%* |

Note)
The mark "*" indicates that the condition fell out of the range defined in the present invention.

is suitable for a substrate of a device, or the like. Therefore, the present invention can be widely applied to the manufacture of silicon wafers and semiconductor devices.

The invention claimed is:

1. A method for manufacturing a silicon wafer, comprising:
    a growth step of growing, by the Czochralski method, a silicon single crystal ingot including no COPs or dislocation clusters;
    a cut-out step of cutting out a silicon wafer from the silicon single crystal ingot;
    a first heat treatment step of performing RTP treatment in which the silicon wafer is retained in an oxidizing atmosphere at a temperature of more than 1250° C. for one second or more;
    an oxide film removing step of removing an oxide film that is formed in the first heat treatment step on a surface of the silicon wafer;
    a second heat treatment step of performing, after performing the oxide film removing step, RTP treatment in which the silicon wafer is retained in a nitriding atmosphere or an Ar atmosphere, at 1100° C. or more for one second or more; and
    an oxygen concentration varying region removing step of removing, after performing the second heat treatment step, a region in the silicon wafer in which an oxygen concentration varies in the first and second heat treatment steps such that an absolute value of an oxygen concentration variation rate of a remaining portion of the silicon wafer becomes less than 10%;
    wherein an oxygen concentration variation rate is (Outermost-layer oxygen concentration average−Bulk oxygen concentration average)/Bulk oxygen concentration average×100(%).

2. A method for manufacturing a silicon wafer, comprising:
    a growth step of growing, by the Czochralski method, a silicon single crystal ingot including no COPs or dislocation clusters;
    a cut-out step of cutting out a silicon wafer from the silicon single crystal ingot;
    a first heat treatment step of performing RTP treatment in which the silicon wafer is retained in an oxidizing atmosphere at a temperature of more than 1250° C. for one second or more;
    an increased-oxygen-concentration region removing step of removing a region in the silicon wafer in which an oxygen concentration increases in the first heat treatment step;
    a second heat treatment step of performing, after performing the increased-oxygen-concentration region removing step, RTP treatment in which the silicon wafer is retained in a nitriding atmosphere or an Ar atmosphere, at 1100° C. or more for one second or more; and
    a decreased-oxygen-concentration region removing step of removing, after performing the second heat treatment step, a region in the silicon wafer in which an oxygen concentration decreases in the second heat treatment step such that an absolute value of an oxygen concentration variation rate of a remaining portion of the silicon wafer becomes less than 10%;
    wherein an oxygen concentration variation rate is (Outermost-layer oxygen concentration average−Bulk oxygen concentration average)/Bulk oxygen concentration average×100(%).

3. The method for manufacturing a silicon wafer according to claim 1, wherein the first heat treatment step is performed in an atmosphere of gas including one or more kinds selected from the group consisting of $O_2$, $O_3$, and $H_2O$.

4. The method for manufacturing a silicon wafer according to claim 1, wherein a retention temperature in the second heat treatment step is lower than a retention temperature in the first heat treatment step.

5. The method for manufacturing a silicon wafer according to claim 1, wherein a temperature drop rate of the second heat treatment step is 10° C./s or more.

6. The method for manufacturing a silicon wafer according to claim 2, wherein the first heat treatment step is performed in an atmosphere of gas including one or more kinds selected from the group consisting of $O_2$, $O_3$, and $H_2O$.

7. The method for manufacturing a silicon wafer according to claim 2, wherein a retention temperature in the second heat treatment step is lower than a retention temperature in the first heat treatment step.

8. The method for manufacturing a silicon wafer according to claim 2, wherein a temperature drop rate of the second heat treatment step is 10° C./s or more.

* * * * *